United States Patent [19]
Yoneda

[11] 3,982,308
[45] Sept. 28, 1976

[54] SEMICONDUCTOR DEVICE CLAMPING APPARATUS

[75] Inventor: Yoshitada Yoneda, Itami, Japan

[73] Assignee: Mitsubishi Denki Kabushiki Kaisha, Tokyo, Japan

[22] Filed: Aug. 27, 1975

[21] Appl. No.: 608,302

[52] U.S. Cl. .................. 24/263 R; 174/16 HS; 357/81
[51] Int. Cl.² .................. H01R 13/54; H01V 7/00; H01L 23/42
[58] Field of Search .......... 24/243 R, 263 R, 263 A, 24/153 S, 243 P, 243 ET; 317/242, 243, 101 A; 73/141 A; 338/48; 357/76, 79, 77, 81; 339/92 R, 9 M; 174/16 HS

[56] References Cited
UNITED STATES PATENTS

| | | |
|---|---|---|
| 1,963,559 | 6/1934 | Proctor .................. 317/242 |
| 2,720,616 | 10/1955 | Vanderhoof .................. 357/77 |
| 2,810,871 | 10/1957 | Weyandt .................. 357/77 |
| 2,891,362 | 6/1959 | Bettridge .................. 317/242 X |
| 3,661,013 | 5/1972 | Wilcox .................. 73/141 A |
| 3,743,893 | 7/1973 | Yamomoto .................. 357/81 |
| 3,789,248 | 1/1974 | Jaecklin et al. .................. 174/16 HS X |
| 3,885,243 | 5/1975 | Weisshaar et al. .................. 357/76 X |
| 3,916,435 | 10/1975 | Camplin et al. .................. 357/81 X |

Primary Examiner—Donald A. Griffin
Attorney, Agent, or Firm—P. J. Thoma

[57] ABSTRACT

A clamping apparatus for holding semiconductor devices in compression is described in which supporting plates are disposed at opposite ends of the apparatus and supporting shafts extend the length of the apparatus connecting the supporting plates. The supporting plates are fixed in place by protrusions in the walls of the supporting shafts. The compressive force is provided by a spring means held in compression by the supporting plates.

4 Claims, 10 Drawing Figures

SEMICONDUCTOR DEVICE CLAMPING APPARATUS

BACKGROUND OF THE INVENTION

1. Field of the Invention

This invention relates to a compression bonded semiconductor device assembly, and more particularly to improvements in a clamping apparatus for holding a semiconductor device between heat sinks or other support members.

2. Description of the Prior Art

Devices of the prior art have previously used clamping mechanisms for holding semiconductor devices in compression. Such mechanisms are adapted to put a semiconductor device having a predetermined number of PN junctions disposed therein in resilient and compressive contact with a heat sink or terminal conductor. The compressive force is supplied by a leaf spring, dish-shaped spring or the equivalent spring means which is held in compression by a pair of supporting plates disposed at opposite ends of the mechanism which in turn are attached to supporting rods disposed lengthwise along the mechanism. In such clamping mechanisms, the supporting plates are generally held in compression by an adjustment of a nut fitted onto a threaded portion disposed on one end of each supporting rod.

FIG. 1 shows by way of example such a clamping mechanism of the conventional construction wherein a solid supporting rod 1 passes through a supporting plate 2, a dish-shaped spring 3, a plate 4 for retaining the dish-shaped spring 3 and a nut 5. The mechanism of FIG. 2 is similar to that of FIG. 1 except that a combined leaf spring and supporting plate 6 performs the dual function of the springs 3 and plate 2 of FIG. 1.

In the mechanism of FIG. 1, a compressive contacting force for a semiconductor device and a heat sink or the like is given by the dish-shaped springs 3 and held by the nut 5 through the retaining plate 4.

In the mechanism of FIG. 2, the compressive contacting force is held by the combined leaf spring and supporting plate 6 which is held in place by the nut 5.

To assemble the mechanism of either of FIGS. 1 and 2, a system may be adopted, for example, using a jig externally applied to the retaining plate 2 or the supporting plate 6, then applying a prescribed force to a semiconductor device by means of the jig and a press, then fastening the nut 5 when the spring 3 or 6 is compressed nearly flat and finally removing the external force.

Such conventional clamping mechanisms are inefficient, slow and have the disadvantage of causing variations in compressive force due to human error in fastening the nuts. Furthermore, the operation is difficult to automate.

Accordingly, it is an object of the present invention to provide an efficient mechanism for clamping semiconductor devices which is suitable for automatic assembly, thus eliminating the above-mentioned problems of prior art mechanisms.

SUMMARY OF THE INVENTION

The present invention is a clamping apparatus for holding semiconductor devices in compression comprising two supporting plates spaced apart in parallel planes, at least two supporting shafts orthogonally connected to the plates, each shaft having a wall, said wall being C-shaped in cross-section, at least one of said plates having end portions vertically slidable within the C-shaped walls of the shafts, said end portions being fixed in place in the shafts by protrusions in the walls of the shafts.

BRIEF DESCRIPTION OF THE DRAWINGS

FIG. 7a is a plan view of the upper surface of a clamping apparatus according to still another embodiment of the present invention; and, FIG. 7b is a vertical cross-sectional view of the embodiment of FIG. 7a.

DESCRIPTION OF THE PREFERRED EMBODIMENTS

Figure 1:
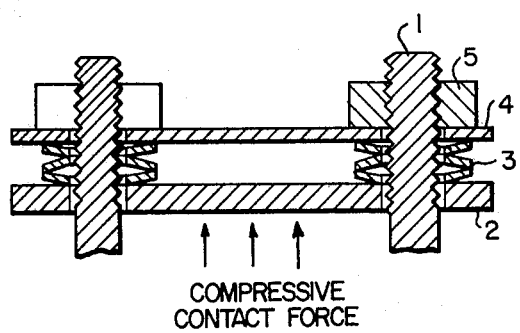
FIGS. 1 and 2 are vertical cross-sectional views of conventional mechanisms for clamping semiconductor devices.

The present invention will now be described in detail with reference to embodiments thereof illustrated in the drawings, in which like reference numerals designate like parts.

Figure 3:
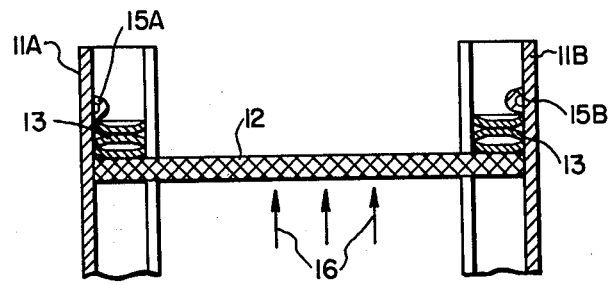
FIGS. 3 and 4 are vertical cross-sectional views of a clamping apparatus according to embodiments of the present invention.

FIG. 3 illustrates a clamping apparatus wherein hollow supporting shafts or sleeves 11A and 11B are connected to ends of a supporting plate 12. Several dish-shaped springs 13 are held in compression in the shafts 11A and 11B against the plate 12 by protrusions 15A and 15B in the walls of the shafts.

Figure 4:
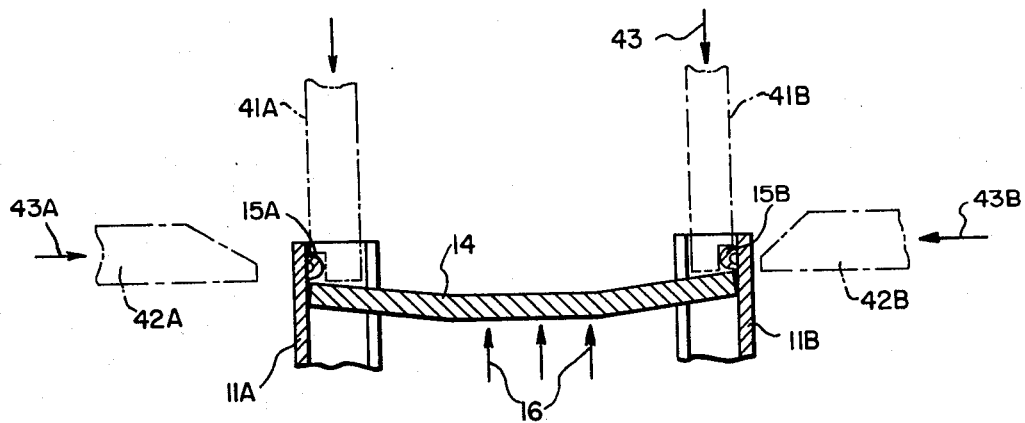

FIG. 4 illustrates a clamping apparatus similar to that of FIG. 3 except that a combined leaf spring and supporting plate 14 performs the dual function of the springs 13 and plate 12 of FIG. 3.

In both FIGS. 3 and 4, upwardly pointing arrows 16 indicate the force exerted against plates 12 and 14 by members (not shown) which are held in compressive force by the clamping apparatus.

Figure 2:
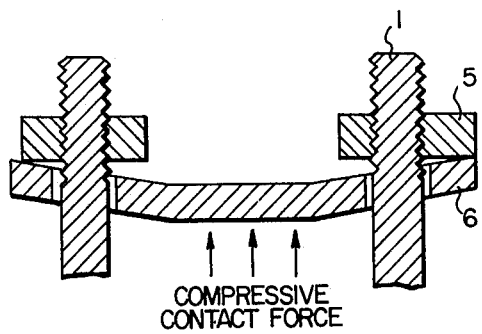

As is apparent from a comparison of FIG. 3 or 4 with the prior art, the present invention is characterized in that the compressive force is held by protrusions 15A and 15B formed on interior walls of the supporting shafts 11A and 11B rather than by the nuts shown in FIGS. 1 and 2.

Figure 5A:
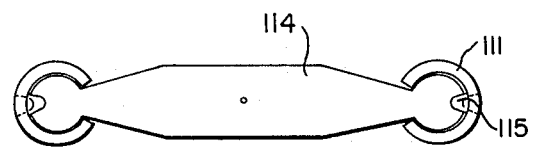
FIGS. 5a, 5b and 5c are plan views of the upper surface of supporting plates according to embodiments of the present invention.
Figure 5B:
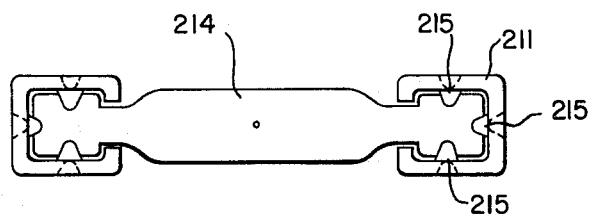
Figure 5C:
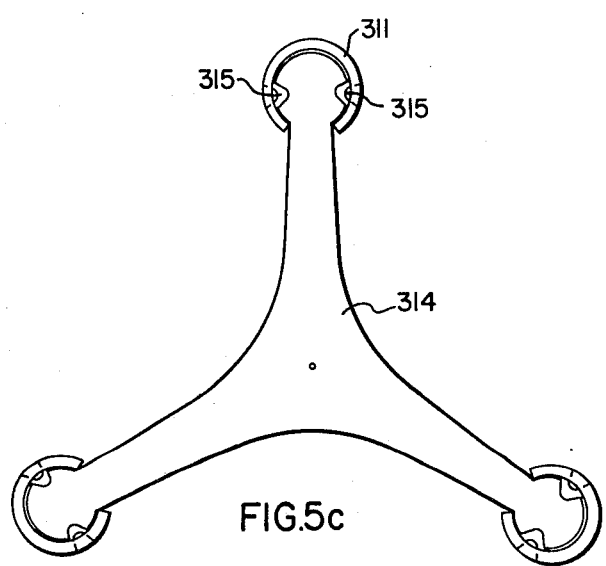

FIGS. 5a, 5b and 5c are views of the upper surface of three sample embodiments of supporting shafts 111, 211 and 311 and plates 114, 214 and 314. FIGS. 5a and 5b show embodiments with two supporting shafts and FIG. 5c shows an embodiment with three supporting shafts. Embodiments of more than three supporting shafts are possible utilizing similar construction. An important feature of the present invention lies in the shape of the supporting shafts and corresponding shape of ends of the supporting plates as shown in FIGS. 5a through 5c.

Specifically, a cross-section of a supporting shaft taken perpendicular to the axis of the shaft is generally C-shaped providing a slot through which an end portion of a supporting plate extends, the end portion resembling the shape of the interior of the shaft so as to permit the end portion to slide lengthwise along the shaft. The end portions of the plates are held in place along the length of the shafts by means of protrusions.

The formation of protrusions can readily be accomplished, as shown, for example in FIG. 4, by using a press (not shown) including retaining tools 41A and 41B, as shown in phantom and staking or cutting tools 42A and 42B. The retaining tools impart a prescribed pressure to the end of the supporting plate 14 which acts as a leaf spring. In the alternate arrangement of FIG. 3, the dish-shaped springs 13 are used to hold the compressive force on plate 12. When the staking tools are operated in the directions of the arrows 43A and 43B shown in FIG. 4, while the retaining tools are pushing against the supporting plate 14 with a prescribed pressure, the inner walls of the C-shaped supporting shafts are deformed to make the protrusions 15A and 15B. This fixes the supporting plate 14 and holds the compressive force. Since the compressive force is held by means of the protrusions 15A and 15B, the walls of the shafts 11A and 11B must, of course, be high in mechanical strength. Such mechanical strength is determined by the material used, the wall thickness, the size and number of the protrusions, and the required compressive force. The present invention has the added flexibility of providing only a single protrusion 115 in each shaft as shown in FIG. 5a, two protrusions 315 as shown in FIG. 5c, or three protrusions 215 as shown in FIG. 5b.

Figure 6:
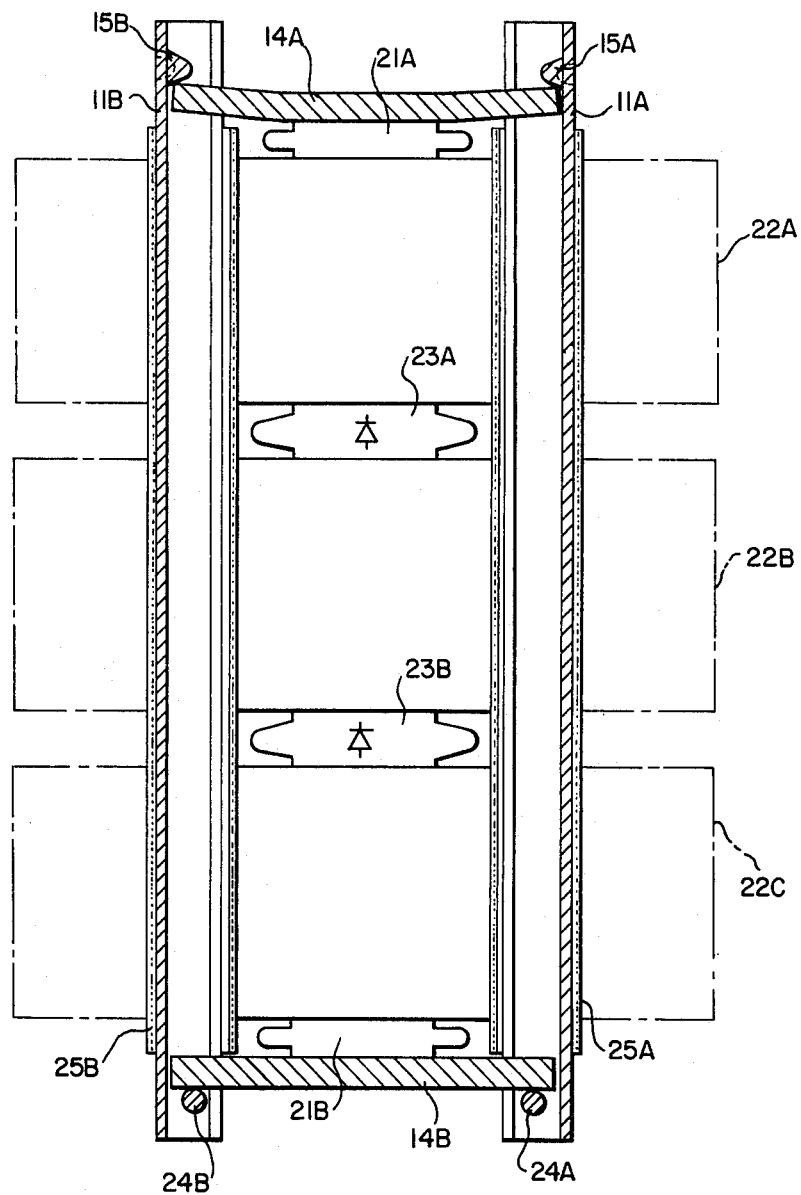
FIG. 6 is a vertical cross-sectional view illustrating a clamping apparatus for an arrangement of a plurality of devices according to another embodiment of the present invention.

FIG. 6 illustrates an additional embodiment of a clamping apparatus of the present invention in which semiconductor devices 23A and 23B are mounted between heat sinks 22A, 22B and 22C. Insulators 21A and 21B electrically isolate the heat sinks from a leaf spring-supporting plate 14A at one end and supporting plate 14B at the other end. Insulating tubes 25A and 25B surround the shafts 11A and 11B, respectively, so as to electrically isolate the shafts from the heat sinks. The semiconductor devices 23A and 23B, the heat sinks 22A, 22B and 22C and the insulators 21A and 21B are held under the pressure of the compressed leaf spring 14A. The clamping force is maintained by protrusions 15A and 15B formed in the wall of the supporting shafts 11A and 11B as previously described. In FIG. 6 the lower supporting plate 14B is fixed by means of the metallic pins 24A and 24B inserted in the shafts 11A and 11B, respectively. Plate 14B may, however, be otherwise fixed as by welding or by protrusions similar to those at the other end. Moreover, it is advantageous to initially fix one end thereof in order to facilitate the assembling operation.

Figure 7A:
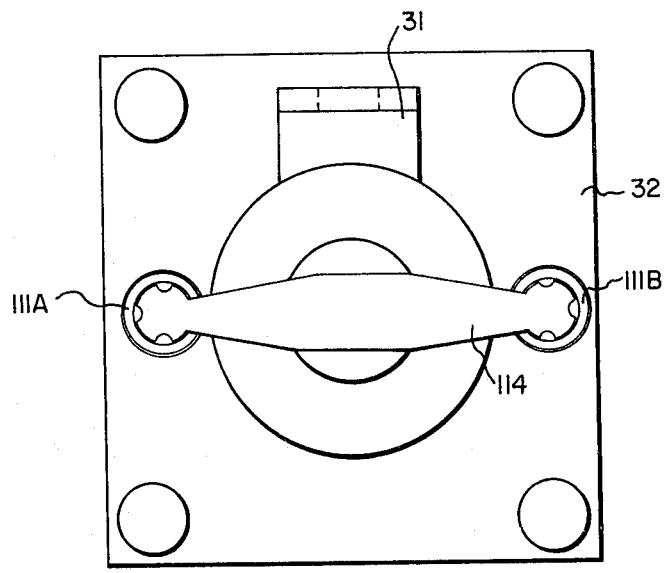
Figure 7B:
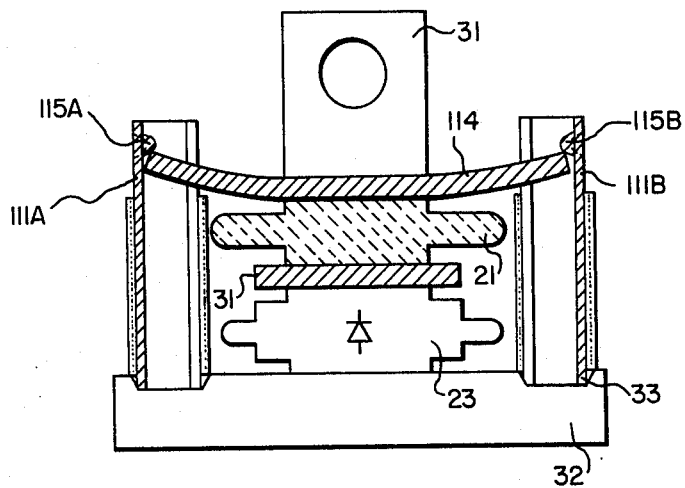

FIGS. 7a and 7b show another embodiment of the present invention wherein a semiconductor device 23 having flat opposed parallel contact surfaces is secured to a flat base 32. In this embodiment the lower ends of the supporting shafts 111A and 111B are brazed to the base 32 as shown. A cathode terminal 31 is provided for external connection to a cathode side of device 23, while an anode connection is provided by the base 32. Insulator 21 electrically isolates the cathode terminal 31 from the leaf spring 114.

It is immediately apparent that the polarity of the finished assembly can readily be reversed by inverting the device 23 in the clamping apparatus assembly. Various circuit arrangements are easily achieved by connecting finished assemblies in the desired fashion.

From the foregoing description taken with the drawings, it will be seen that the present invention provides a novel semiconductor device clamping apparatus. Advantages of automatic assembly and controllable clamping force are provided by the present invention.

What is claimed is:

1. A clamping apparatus for holding semiconductor devices in compression comprising two supporting plates spaced apart in parallel planes, at least two supporting shafts orthogonally connected to the plates, each shaft having a wall, said wall being C-shaped in cross-section, at least one of said plates having end portions vertically slidable within the C-shaped walls of the shafts, said end portions being fixed in place in the shafts by protrusions in the walls of the shafts, at least one semiconductor device and at least one heat sink held in compression between the supporting plates, and spring means cooperating with the supporting plates and the supporting shafts to maintain a compressive force exerted on the semiconductor device.

2. The apparatus of claim 1 wherein the spring means consists of dish-shaped springs mounted in the supporting shafts.

3. The apparatus of claim 1 wherein the spring means consists of at least one leaf spring cooperating with the supporting shafts.

4. A clamping apparatus for holding a semiconductor device in compression comprising: first and second hollow supporting shafts, walls forming an axial slot in each of said shafts, a first supporting plate affixed to said shafts and holding said shafts in parallel, a second supporting plate spaced apart from said first supporting plate and adapted to slidably engage the hollow interior of said shafts through said axial slots, spring means for receiving an externally applied compressive force exerted on said plates, protrusions in said walls of said shafts for holding said second supporting plate in a predetermined position, said protrusions projecting into the hollow interior of said shafts to abut said second supporting plate, whereby a predetermined compressive force is maintained on a semiconductor device disposed between said plates.

* * * * *